(12) United States Patent
Tamai et al.

(10) Patent No.: US 6,512,359 B1
(45) Date of Patent: Jan. 28, 2003

(54) CURRENT DETECTOR USING MAGNETIC-ELECTRIC CONVERSION ELEMENT AND ELECTRIC CONNECTION BOX USING THE SAME

(75) Inventors: Yasuhiro Tamai, Shizuoka-ken (JP);
Takashi Gohara, Shizuoka-ken (JP);
Yoshinori Ikuta, Shizuoka-ken (JP);
Mitsuaki Morimoto, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 107 days.

(21) Appl. No.: 09/655,786

(22) Filed: Sep. 6, 2000

(30) Foreign Application Priority Data

Sep. 7, 1999 (JP) .............................. 11-253329

(51) Int. Cl.[7] .............................................. G01R 33/00
(52) U.S. Cl. .............................. 324/117 R; 324/117 H
(58) Field of Search ........................ 324/117 H, 117 R, 324/126, 127, 252, 251; 338/32 H; 327/511

(56) References Cited

U.S. PATENT DOCUMENTS 3,323,057 A * 5/1967 Haley ..................... 324/117 H
5,841,272 A * 11/1998 Smith et al. ............ 324/117 H
6,040,690 A * 3/2000 Ladds ..................... 324/117 H
6,271,656 B1 * 8/2001 Juds et al. .............. 324/117 R

FOREIGN PATENT DOCUMENTS

JP             5-223849          9/1993

* cited by examiner

*Primary Examiner*—Vinh P. Nguyen
(74) *Attorney, Agent, or Firm*—Finnegan, Henderson, Farabow, Garrett & Dunner, L.L.P.

(57) ABSTRACT

A current detector includes; a conductor to be measured in which a through hole is formed, the conductor to be measured having a first branch path and a second branch path for dividing a current flowing into two portions; a first magnetic-electric conversion element being arranged in the through hole of the conductor to be measured, the first magnetic-electric conversion element being provided for detecting a disturbance; and a second magnetic-electric conversion element being arranged outside of the first branch path and the second branch path formed in the conductor to be measured.

11 Claims, 5 Drawing Sheets

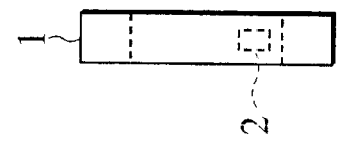
FIG.1C
PRIOR ART
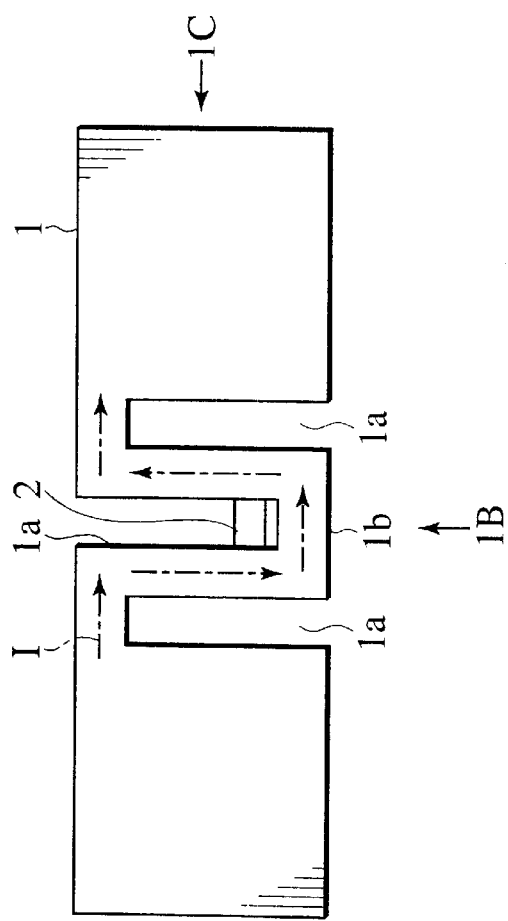
FIG.1A
PRIOR ART
FIG.1B
PRIOR ART

CURRENT DETECTOR USING MAGNETIC-ELECTRIC CONVERSION ELEMENT AND ELECTRIC CONNECTION BOX USING THE SAME

BACKGROUND OF THE INVENTION

1. Field of the Invention

The present invention relates to a current detector for detecting a current flowing in an electric circuit mounted on an equipment such as an automobile or the like, and particularly to a current detector which can increase a current detecting accuracy, and an electric connection box using the same.

2. Description of the Prior Art

Conventionally, there has been known a current detector for detecting a current flowing in an electric circuit, for example, mounted on an automobile by using a Hall element corresponding to one of magnetic-electric conversion elements. One example of this kind of current detector is disclosed in Japanese Patent Application Laid-Open No. 5-223849. The current detector is provided, as shown in FIGS. 1A to 1C, with a conductor 1 forming a loop-shaped current path 1b by applying notches 1a on the same plane or bending so as to flow a current to be detected I, and a magnetic-electric conversion element 2 converting a magnetic flux generated by the current to be detected I flowing through the conductor 1 into an electric signal.

In this current detector, the current to be detected I flows through the loop-shaped current path 1b formed in the conductor 1, whereby the magnetic flux is generated. The magnetic flux is converted into the electric signal by the magnetic-electric conversion element 2, whereby an electric signal in proportion to magnitude of the current to be detected I can be obtained. Since this current detector senses two times or more magnetic flux in comparison with the case that the electric-magnetic conversion element is placed near a straight conductor, it is possible to increase an accuracy of detecting the current.

However, in the current detector disclosed in Japanese Patent Application Laid-Open No. 5-223849, since the magnetic flux generated by the current flowing through the conductor body except the conductor to be measured becomes a disturbance and gives an influence to a detected result, there is a problem that it is impossible to accurately detect the current flowing through the conductor to be measured.

SUMMARY OF THE INVENTION

An object of the present invention is to provide a current detector which can accurately detect a current flowing through a conductor to be measured and an electric connection box using the electric detector.

The present invention is structured as follows in order to achieve the object mentioned above. According to a first aspect of the present invention, there is provided a current detector comprising: a conductor to be measured in which a through hole is formed, the conductor to be measured having a first branch path and a second branch path for dividing a current flowing into two portions; a first magnetic-electric conversion element being arranged in the through hole of the conductor to be measured, the first magnetic-electric conversion element being provided for detecting a disturbance; and a second magnetic-electric conversion element being arranged outside of the first branch path and the second branch path formed in the conductor to be measured.

According to the invention, the current flowing through the conductor to be measured flows through the first branch path and the second branch path in a diverged manner. In this case, since a direction and a magnitude of the current flowing through the first branch path is the same as those of the current flowing through the second branch path, the magnetic flux generated by the current flowing through the first branch path and the magnetic flux generated by the current flowing through the second branch path have the same strength and opposite directions at a position of the through hole.

As a result, since both of the magnetic flux deny together at the position of the through hole, the first magnetic-electric conversion element arranged in the through hole outputs zero if a magnetic flux other than the magnetic flux on the basis of the current flowing through the conductor to be measured (hereinafter, refer to as "a disturbance magnetic field") does not exist. This means that the first magnetic-electric conversion element outputs an electric signal corresponding to a strength of the disturbance magnetic field.

On the other hand, since the second magnetic-electric conversion element is arranged outside the first branch path or the second branch path, the second magnetic-electric conversion element outputs an electric signal corresponding to a strength of a combined magnetic field between the magnetic field generated by the current flowing through the first branch path and the magnetic field generated by the current flowing through the second branch path. At this time, if a disturbance magnetic field input to the second magnetic-electric conversion element exists, the second magnetic-electric conversion element outputs an electric signal corresponding to a strength of a magnetic field obtained by combining the disturbance magnetic field with the combined magnetic field.

Accordingly, for example, when a correction is performed so as to remove the electric signal from the first magnetic-electric conversion element from the electric signal from the second magnetic-electric conversion element, the corrected electric signal accurately reflect the magnitude of the current flowing through the conductor to be measured, so that it is possible to accurately detect the current flowing through the conductor to be measured.

Further, according to a second aspect of the present invention as it depends from the first aspect, there is provided a current detector, wherein the second magnetic-electric is arranged on the same plane as a plane including the first branch path and the second branch path and arranged outside both of the first branch path and the second branch path.

According to the invention, since the second magnetic-electric conversion element is arranged on the same plane as the plane including the first branch path and the second branch path formed in the conductor to be measured and outside the first branch path or the second branch path, each of the magnetic flux generated by the current flowing through the first branch path and the magnetic flux generated by the current flowing through the second branch path substantially vertically passes through a magnetic sensing surface of the second magnetic-electric conversion element, so that a greater electric signal is output, whereby a higher sensibility can be obtained.

According to a third aspect of the present invention as it depends from the first or the second aspect, there is provided a current detector further comprising: a correction portion for correcting an electric signal output from the second magnetic-electric conversion element on the basis of another electric signal output from the first magnetic-electric conversion element.

According to the invention, the correction portion corrects the electric signal output from the second magnetic-electric conversion element on the basis of the electric signal output from the first magnetic-electric conversion element. The correction can be performed, for example, in such a manner as to remove the electric signal from the first magnetic-electric conversion element from the electric signal from the second magnetic-electric conversion element. As a result, since the electric signal output from the correction portion accurately reflects the magnitude of the current flowing through the conductor to be measured, it is possible to accurately detect the current flowing through the conductor to be measured.

According to a fourth aspect of the present invention, there is provided an electric connection box, comprising: a plurality of conductors being arranged substantially in parallel to each other; and a current detector, wherein the current detector comprises: a conductor to be measured which is made of any one of the plurality of conductors being arranged substantially in parallel to each other by being formed with a through hole, the conductor to be measured having a first branch path and a second branch path for dividing a current flowing into two portions; a first magnetic-electric conversion element being arranged in the through hole of the conductor to be measured, the first magnetic-electric conversion element being provided for detecting a disturbance; and a second magnetic-electric conversion element being arranged outside of the first branch path and the second branch path formed in the conductor to be measured.

According to the invention mentioned above, since the current detector is provided in the electric connection box in which a plurality of conductors are arranged, any one of a plurality of conductors is set to the conductor to be measured, the through hole is formed in the conductor to be measured, and the first branch path and the second branch path for dividing the current flowing by the through hole into two portions are formed in the conductor to be measured, the magnetic flux generated by the current flowing through the first branch path and the magnetic path generated by the current flowing through the second branch path deny together at the position of the through hole, so that the first magnetic-electric conversion element outputs the electric signal corresponding to the strength of the disturbance magnetic field. On the contrary, the second magnetic-electric conversion element outputs the electric signal corresponding to the strength of the magnetic afield obtained by further combining the disturbance magnetic field with the combined magnetic field between the magnetic field generated by the current flowing through the first branch path and the magnetic field generated by the current flowing through the second branch path.

Accordingly, for example, when a correction is performed so as to remove the electric signal from the first magnetic-electric conversion element from the electric signal from the second magnetic-electric conversion element, the corrected electric signal accurately reflect the magnitude of the current flowing through the conductor to be measured, so that it is possible to apply the current detector which can accurately detect the current flowing through the conductor to be measured to the electric connection box.

According to a fifth aspect of the present invention as it depends from the fourth aspect, there is provided an electric connection box, wherein the other conductor except the conductor to be measured among the plurality of conductors is arranged in such a manner that a distance between the other conductor and the first magnetic-electric conversion element is substantially equal to a distance between the other conductor and the second magnetic-electric conversion element.

In accordance with the invention mentioned above, since the conductors except the conductor to be measured among a plurality of conductors are arranged so that the distance between the conductor and the first magnetic-electric conversion element is substantially equal to the distance between the conductor and the second magnetic-electric conversion element, each of the first magnetic-electric conversion element and the second magnetic-electric conversion element is affected by the magnetic field from the conductor in a substantially uniform manner. Accordingly, when the correction is performed in such a manner as to remove the electric signal from the first magnetic-electric conversion element from the electric signal from the second magnetic-electric conversion element, the corrected electrical signal is not affected by the magnetic field from the conductor at all, so that it is possible to obtain an accurate current detecting value.

BRIEF DESCRIPTION OF THE ACCOMPANYING DRAWINGS

FIGS. 1A to 1C are views for explaining a conventional current detector;

DESCRIPTION OF THE PREFERRED EMBODIMENT

A description will be in detail given below of a current detector according to an embodiment of the present invention and an electric connection box using the same with reference to the accompanying drawings.

Figure 2:
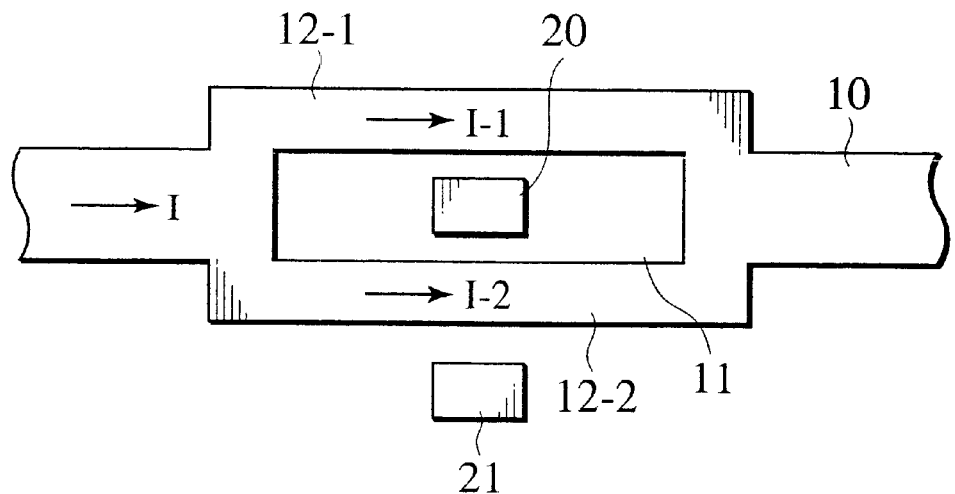
FIG. 2 is a plan view showing a structure of a current detector according to an embodiment of the present invention.

FIG. 2 is a plan view showing a structure of a current detector. The current detector is constituted by a conductor to be measured 10 in which a first branch path 12-1 and a second branch path 12-2 are formed, a first Hall element 20 and a second Hall element 21. A portion where the first branch path 121 and the second branch path 12-2 of the conductor to be measured 10 are formed, the first Hall element 20 and the second Hall element 21 are generally received in an electric connection box (not shown) provided with a plurality of conductors and provided in an automobile or the like.

The conductor to be measured 10 is constituted by a plate-like conductor. A through hole 11 is pierced in a substantially center portion of the conductor to be measured 10, whereby the first branch path 12-1 and the second branch path 12-2 are formed. At this time, a width of each of the conductors in the first branch path 12-1 and the second branch path 12-2 is determined so that a half of a current I flowing through the conductor to be measured 10 constitutes a current I-1 flowing through the first branch path 12-1, and another half constitutes a current I-2 flowing through the second branch path 12-2.

The first Hall element 20 corresponds to a first magnetic-electric conversion element according to the present invention. The first Hall element 20 generates a voltage (Hall voltage) signal corresponding to a magnetic flux density input to a magnetic sensing surface (a magnetic flux detecting surface). A predetermined current is supplied to the first Hall element 20 via a lead wire (not shown). Further, the voltage signal generated in the first Hall element 20 is taken out to an external portion via a lead wire (not shown).

The first Hall element 20 is arranged in a substantially center portion of the through hole 11 so that the magnetic sensing surface forms substantially the same surface as the surface of the first branch path 12-1 and the second branch path 12-2. Accordingly, the magnetic flux generated by the current I-1 flowing through the first branch path 12-1 and the magnetic flux generated by the current I-2 flowing through the second branch path 12-2 vertically cross the magnetic sensing surface of the first Hall element 20. In this case, a direction of the magnetic flux generated by the current I-1 is opposed to a direction of the magnetic flux generated by the current I-2 flowing through the second branch path 12-2.

The second Hall element 21 corresponds to a second magnetic-electric conversion element according to the present invention. The second Hall element 21 also generates a voltage signal corresponding to a magnetic flux density input to a magnetic sensing surface, in the same manner as that of the first Hall element 20 mentioned above. Then, the structure is made such that a predetermined current is supplied to the second Hall element 21 via a lead wire (not shown), and the voltage signal generated in the second Hall element 21 is taken out to an external portion via a lead wire (not shown).

The second Hall element 21 is arranged outside the second branch path 12-2 so that the magnetic sensing surface forms substantially the same surface as the surface of the first branch path 12-1 and the second branch path 12-2. Accordingly, the magnetic flux generated by the current I-1 flowing through the first branch path 12-1 and the magnetic flux generated by the current I-2 flowing through the second branch path 12-2 vertically cross the magnetic sensing surface of the second Hall element 21. In this case, a direction of the magnetic flux generated by the current I-1 is the same as a direction of the magnetic flux generated by the current I-2 flowing through the second branch path 12-2.

In this case, the second Hall element 21 mentioned above may be arranged outside (in an upper side in the drawing of) the first branch path 12-1. Further, the first Hall element 20 and the second Hall element 21 may be arranged so that the magnetic sensing surfaces thereof form substantially the same surface as a back surface of the first branch path 12-1 and the second branch path 12-2.

Next, a description will be given of an operation of the current detector according to the embodiment of the present invention structured in the manner mentioned above.

Figure 3:
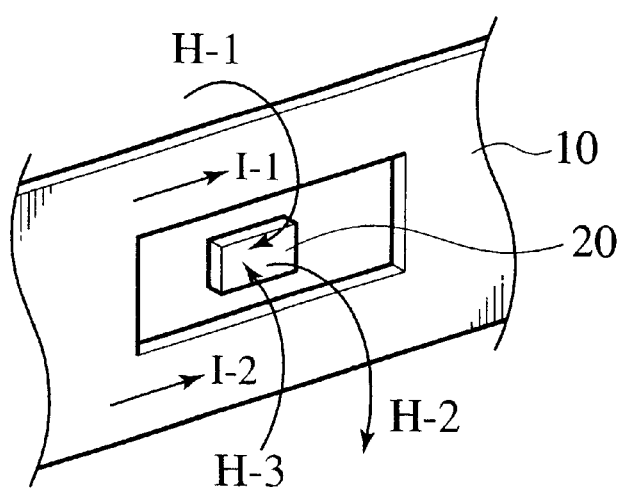
FIG. 3 is a view for explaining an operation of a first Hall element in FIG. 1.

When the current to be measured I flows through the conductor to be measured 10, a half of the current to be measured I flows through the first branch path 12-1 as a current I1, as shown in FIG. 3. Accordingly, as illustrated, there is generated a magnetic field H-1 having a strength corresponding to a magnitude of the current I-1 in a direction of an illustrated arrow in accordance with an Ampere's right-handed screw rule. Since the magnetic flux generated by the magnetic flux H-1 is generated so as to vertically enter the magnetic sensing surface of the first Hall element 20, by setting the magnetic flux density at this time to B, the magnetic flux having the magnetic flux density B enters into the magnetic sensing surface.

In the same manner, another half of the current to be measured I flows through the second branch path 12-2 as a current I-2. Accordingly, as illustrated, there is generated a magnetic field H-2 having a strength corresponding to a magnitude of the current I-2 in a direction of an illustrated arrow in accordance with an Ampere's right-handed screw rule. Since the magnetic flux generated by the magnetic flux H-2 is generated so as to vertically move outward from the magnetic sensing surface of the first Hall element 20. In this case, since the current I-2 is equal to the current I-1, the magnetic flux having the magnetic flux density B moves outward from the magnetic sensing surface.

Accordingly, if a disturbance magnetic field moving inward to and outward from the magnetic sensing surface of the first Hall element 20 does not exist, the magnetic flux by the magnetic field H-1 and the magnetic flux by the magnetic field H-2 deny together. As a result, the first Hall element 20 outputs zero as an electric signal. However, if a disturbance magnetic field H-3 such as a magnetic field generated on the basis of the current flowing through the other conductors and a magnetic field input from an external portion exists, the first Hall element 20 generates a disturbance voltage signal having a magnitude corresponding to the disturbance magnetic field H-3.

Figure 4:
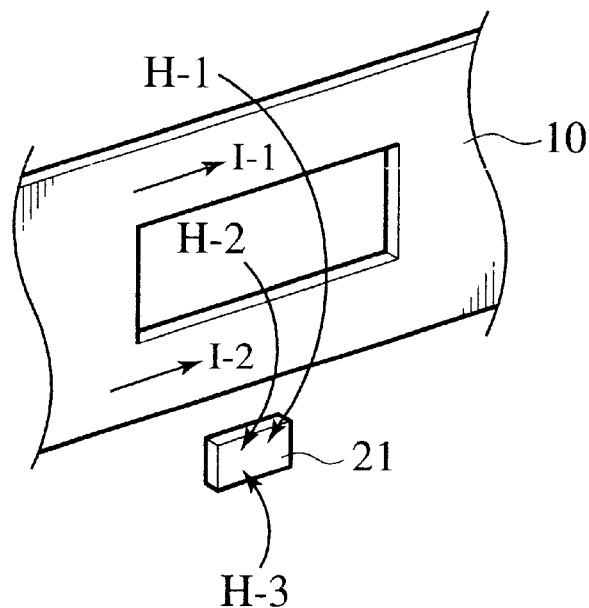
FIG. 4 is a view for explaining an operation of a second Hall element in FIG. 2.

On the contrary, a consideration will be given to the magnetic field on the magnetic sensing surface of the second Hall element 21. If the disturbance magnetic field moving inward to and outward from the magnetic sensing surface of the second Hall element 21 does not exist, the magnetic flux generated by the magnetic field H-1 and the magnetic flux generated by the magnetic field H-2 are combined as shown in FIG. 4, whereby the magnetic fields H-1 and H-2 generated by the current to be measured I flowing through the conductor to 5 be measured 10 vertically enter the magnetic sensing surface of the second Hall element 21.

However, the disturbance magnetic field H3 mentioned above exists, a magnetic flux generated by a magnetic field obtained by further combining a disturbance magnetic field H-3 with the magnetic fields H-I and H-2 mentioned above vertically enters the magnetic sensing surface of the second Hall element 21. Accordingly, the second Hall element 21 generates a voltage signal including the disturbance voltage signal on the basis of the disturbance magnetic field H-3.

Figure 6:
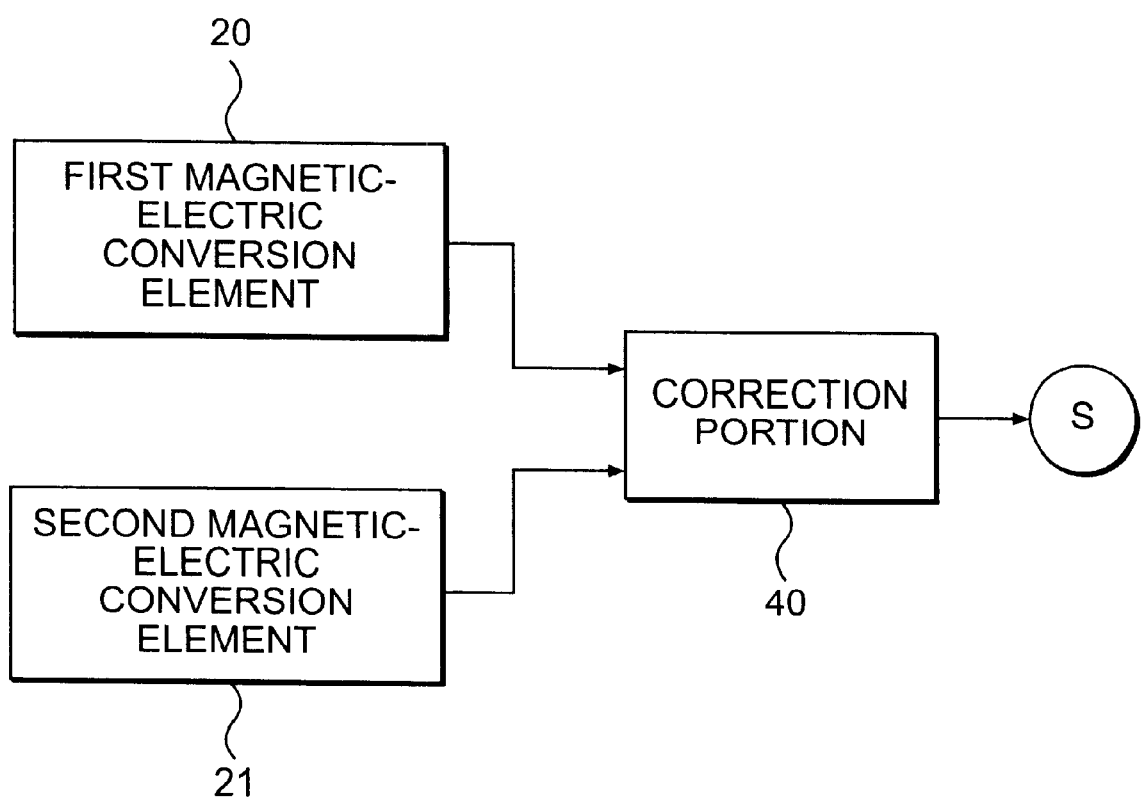
FIG. 6 is a view showing a correction portion of the current detector according to an embodiment of the present invention.

A voltage signal including a disturbance voltage signal from the first Hall element 20 and a disturbance voltage signal from the second Hall element 21 is input to a correction portion 40 as shown in FIG. 6. The correction portion 40 is, for example, constituted by a subtractor.

The correction portion 40 outputs a voltage signal S obtained by subtracting the disturbance voltage signal from the first Hall element 20 from the voltage signal including the disturbance voltage signal from the second Hall element 21. Accordingly, the voltage signal output from the correction portion 40 accurately reflect the magnitude of the current I flowing through the conductor to be measured 10.

Figure 5:
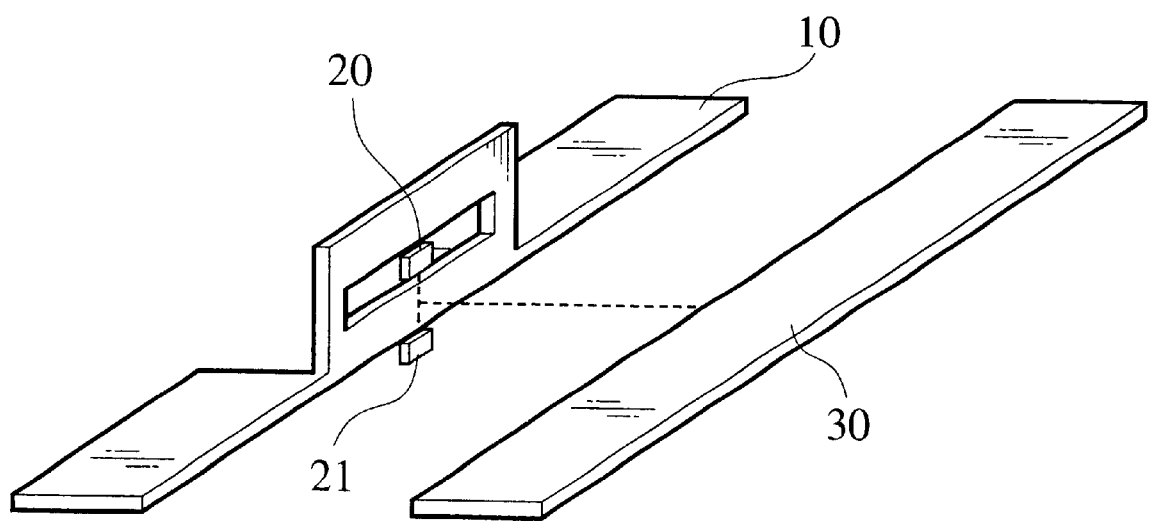
FIG. 5 is a view for explaining a preferable arrangement of the other conductors in the case of applying the current detector according to the embodiment of the present invention.

In particular, in the electric connection box for the automobile in which a plurality of conductors are arranged, as shown in FIG. 5, the other conductors 30 than the conductor to be measured 10 are arranged so as to pass through a middle point of a line connecting between the first Hall element 20 and the second Hall element 21 and exist on a plane vertical to the line.

That is, when the conductors are arranged so that a distance between the other conductors 30 and the first Hall element 20 and a distance between the other conductors 30 and the second Hall element 21 are substantially equal to each other, each of the first Hall element 20 and the second Hall element 21 is affected by the magnetic field from the other conductors 30 in a substantially uniform manner. Accordingly, when a correction is performed in such a manner as to remove the electric signal from the first Hall element 20 from the electric signal from the second Hall element 21, the corrected electric signal is not affected by the magnetic field (the magnetic flux) from the other conductors 30 at all, whereby a current detected value can be obtained at a high accuracy.

As described above, in accordance with the current detector according to this embodiment, the first branch path 12-1 and the second branch path 12-2 are formed by providing the through hole 11 in the conductor to be measured 10, the first Hall element 20 for detecting the disturbance is arranged in the center of the through hole 11, and the second Hall element 21 is arranged near the first branch path 12-1 or the second branch path 12-2. Then, the value obtained by subtracting the voltage signal from the first Hall element 20 from the voltage signal from the second Hall element 21 is output as the detected signal. Accordingly, since the influence of the disturbance magnetic flux from the other conductors 30 can be removed, the detected result can be obtained at a high accuracy.

Figure 7:
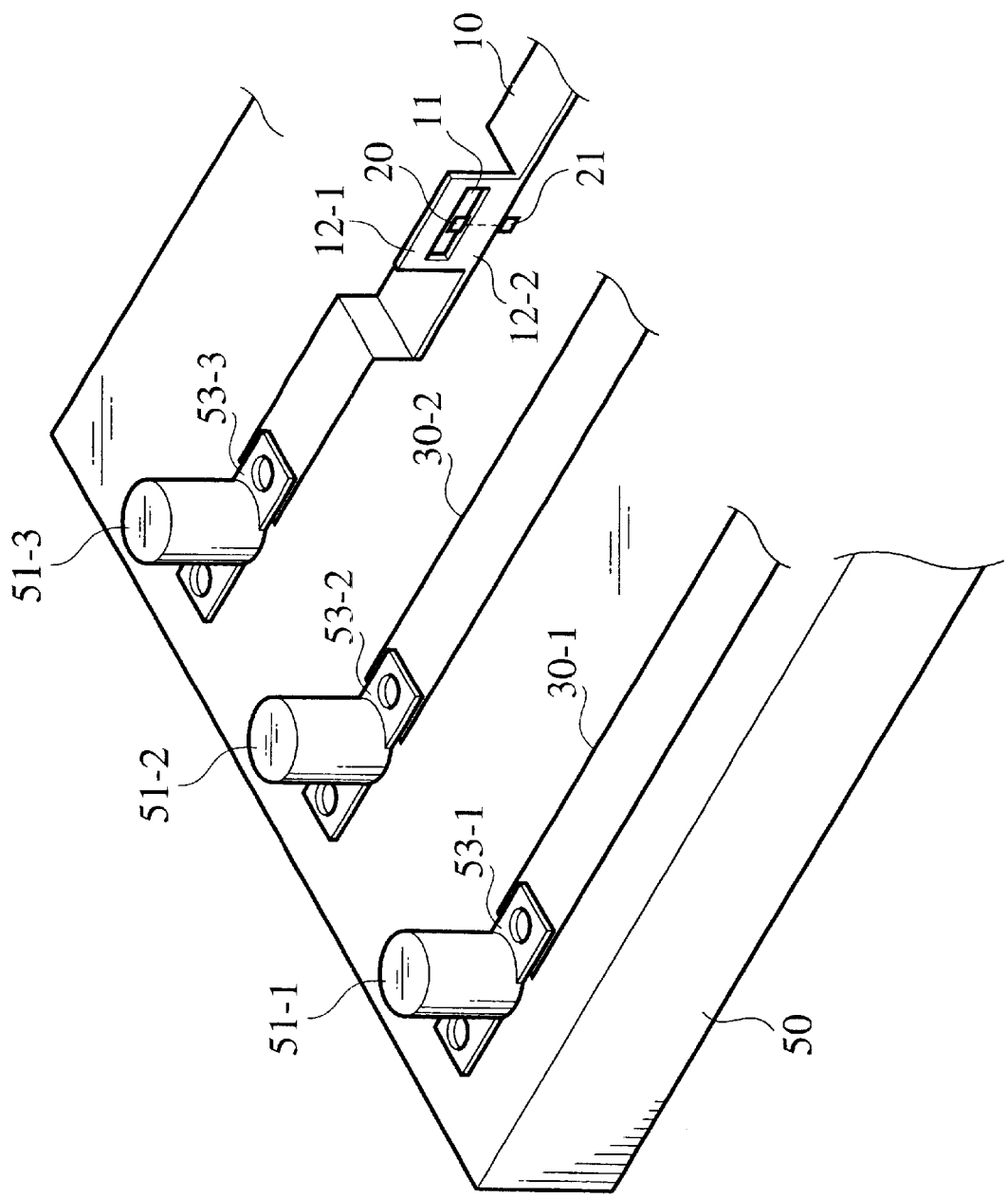
FIG. 7 is a view showing an example which the current detector according to the embodiment of the present invention is applied to an electric connection box for an automobile.

Next, a description will be given of an embodiment in which the current detector according to the embodiment of the present invention is applied to an electric connection box for an automobile with reference to FIG. 7.

An electric connection box 50 is formed in a rectangular parallelepiped. The conductor to be measured 10, a first other conductor 30-1 and a second other conductor 30-2 corresponding to a plurality of conductors are arranged on an upper surface side. A plurality of conductors 10, 30-1 and 30-2 are arranged substantially in parallel to each other.

A first breaker 51-1 is connected to the first other conductor 30-1 via a first bus bar 53-1, a second breaker 51-2 is connected to the second other conductor 30-2 via a second bus bar 53-2, and a third breaker 51-3 is connected to the conductor to be measured 10 via a third bus bar 53-3.

Each of the first breaker 51-1, the second breaker 51-2 and the third breaker 51-3 is structured such as to shut the current flowing through the conductor when the current flowing through the conductor connected to the breaker, for example, becomes over a predetermined current value to an excessive current, or shut the current flowing through the conductor in accordance with an abnormality signal from the vehicle (for example, a collision signal when the vehicle collides).

In the electric connection box 50, the current detector is provided in the conductor to be measured 10. In this current detector, the through hole 11 is formed in a part of the conductor to be measured 10, and the first branch path 12-1 and the second branch path 12-2 for dividing the flowing current into two portions by the through hole 11 are formed.

Further, the first Hall element 20 for detecting the disturbance is arranged in the through hole 11 of the conductor to be measured 10, and the second Hall element 21 is arranged outside the first branch path 12-1 or the second branch path 12-2 formed in the conductor to be measured 10.

Further, each of the first other conductor 30-1 and the second other conductor 30-2 is arranged so that the distance between the conductor and the first Hall element 20 and the distance between the conductor and the second Hall element 21 are substantially equal to each other.

According to the electric connection box 50 structured in this manner, since the current detector is provided in the conductor to be measured 10 among a plurality of conductors, the through hole 11 is formed in the conductor to be measured 10, and the first branch path 12-1 and the second branch path 12-2 for dividing the flowing current into two portions by the through hole 11 are formed in the conductor to be measured 10, the magnetic flux generated by the current flowing through the first branch path 12-1 and the magnetic flux generated by the current flowing through the second branch path 12-2 deny together at the position of the through hole 11. Accordingly, the first Hall element 20 outputs the electric signal corresponding to the strength of the disturbance magnetic flux generated by the current flowing each of the first other conductor 30-1 and the second other conductor 30-2.

On the contrary, the second Hall element 21 outputs an electric signal corresponding to a strength of a magnetic flux obtained by further combining the disturbance magnetic flux generated by the current flowing through each of the first other conductor 30-1 and the second other conductor 30-2 with the combined magnetic flux between the magnetic flux generated by the current flowing through the first branch path 12-1 and the magnetic flux generated by the current flowing through the second branch path 12-2.

Accordingly, for example, when a correction is performed in such a manner as to remove the electric signal from the first Hall element 20 from the electric signal from the second Hall element 21, the corrected electric signal accurately reflect the magnitude of the current flowing through the conductor to be measured 10, so that it is possible to apply the current detector which can accurately detect the current flowing through the conductor to be measured 10 to the electric connection box 50.

Further, since each of the first other conductor 30-1 and the second other conductor 30-2 is arranged so that a distance between the conductor and the first Hall element 20 and a distance between the conductor and the second Hall element 21 are substantially equal to each other, each of the first Hall element 20 and the second Hall element 21 is affected by the magnetic field from the conductor in a substantially uniform manner.

Accordingly, when a correction is performed in such a manner as to remove the electric signal from the first Hall element 20 from the electric signal from the second Hall element 21, the corrected electric signal is not affected by the magnetic field from the conductor at all, whereby a current detected value can be obtained at a high accuracy.

The entire contents of Japanese Patent Application P11-253329 (filed Sep. 7, 1999) are incorporated herein by reference.

Although the invention has been described above by reference to certain embodiments of the invention, the invention is not limited to the embodiments described above. Modifications and variations of the embodiments described above will occur to those skilled in the art, in light of the above teachings. The scope of the invention is defined with reference to the following claims.

What is claimed is:
1. A current detector comprising:
   a conductor having a through hole for dividing the conductor into a first branch path and a second branch path such that a current flowing through the conductor is divided into the first branch path and the second branch path, the first branch path and the second branch path being disposed substantially in the same plane;

a first magnetic-electric conversion element having a first surface for detecting magnetic flux and disposed inside the through hole in the same plane as that of the first and second branch paths and; and a second magnetic-electric conversion element having a second surface for detecting magnetic flux and disposed outside the through hole adjacent to one of the first and second branch paths.

2. A current conductor according to claim 1, wherein the second magnetic-electric conversion element is arranged in the same plane as that of the first and second branch paths.

3. A current conductor according to claim 1, further comprising:

a correction portion for correcting an electric signal output from the second magnetic-electric conversion element based on another electric signal output from the first magnetic-electric conversion element.

4. A current conductor according to claim 1, further comprising:

a correction portion for correcting an electric signal output from the first magnetic-electric conversion element based on another electric signal output from the second magnetic-electric conversion element.

5. A current conductor according to claim 1, wherein the first and second magnetic-electric conversion elements are arranged such that the first magnetic-electric conversion element detects only a disturbance, while the second magnetic-electric conversion element detects both the disturbance and magnetic flux induced by currents flowing through the first and second branch paths.

6. A current conductor according to claim 1, wherein the conductor is a flat conductor.

7. An electric connection box comprising a plurality of conductors arranged substantially in parallel to each other, one of the plurality of conductors comprising:

a conductor having a through hole for dividing the conductor into a first branch path and a second branch path such that a current flowing through the conductor is divided into the first branch path and the second branch path, the first branch path and the second branch path being disposed substantially in the same plane;

a first magnetic-electric conversion element having a first surface for detecting magnetic flux and disposed inside the through hole in the same plane as that of the first and second branch paths and; and a second magnetic-electric conversion element having a second surface for detecting magnetic flux and disposed outside the through hole adjacent to one of the first and second branch paths.

8. An electric connection box according to claim 7, wherein the other conductors are arranged such that a distance between one of the other conductors and the first magnetic-electric conversion element is substantially equal to a distance between the one of the other conductors and the second magnetic-electric conversion element.

9. An electric connection box according to claim 7, further comprising:

a correction portion for correcting an electric signal output from the second magnetic-electric conversion element based on another electric signal output from the first magnetic-electric conversion element.

10. An electric connection box according to claim 7, further comprising:

a correction portion for correcting an electric signal output from the first magnetic-electric conversion element based on another electric signal output from the second magnetic-electric conversion element.

11. An electric connection box according to claim 7, wherein the first and second magnetic-electric conversion elements are arranged such that the first magnetic-electric conversion element detects only a disturbance, while the second magnetic-electric conversion element detects a sum of the disturbance and magnetic flux induced by currents flowing through the first and second branch paths.

* * * * *